United States Patent
Kumatoriya et al.

(10) Patent No.: US 7,999,983 B2
(45) Date of Patent: Aug. 16, 2011

(54) LENS MATERIAL, OPTICAL ELECTRONIC COMPONENT AND OPTICAL ELECTRONIC DEVICE

(75) Inventors: Makoto Kumatoriya, Otsu (JP); Shinichiro Chiku, Kyoto (JP); Mikio Geho, Otsu (JP); Takashi Fujii, Otsu (JP); Kenji Kitamura, Tsukuba (JP); Shunji Takekawa, Tsukuba (JP); Masaru Nakamura, Tsukuba (JP)

(73) Assignee: National Institute for Materials Science, Ibaraki (JP)

( * ) Notice: Subject to any disclaimer, the term of this patent is extended or adjusted under 35 U.S.C. 154(b) by 1412 days.

(21) Appl. No.: 10/595,942

(22) PCT Filed: Oct. 13, 2004

(86) PCT No.: PCT/JP2004/015046
§ 371 (c)(1),
(2), (4) Date: May 20, 2006

(87) PCT Pub. No.: WO2005/049897
PCT Pub. Date: Jun. 2, 2005

(65) Prior Publication Data
US 2009/0108232 A1   Apr. 30, 2009

(30) Foreign Application Priority Data
Nov. 21, 2003 (JP) ................. 2003-392870

(51) Int. Cl.
*G02B 5/32* (2006.01)
*G02B 26/08* (2006.01)
*G02B 26/10* (2006.01)
*G02B 13/14* (2006.01)
*G03H 1/02* (2006.01)
*G02F 1/29* (2006.01)

(52) U.S. Cl. ........ 359/19; 359/7; 359/201.2; 359/215.1; 359/299; 359/355; 359/356

(58) Field of Classification Search ............. 252/182.32; 359/326, 19, 17, 201, 215.1, 299, 355, 356
See application file for complete search history.

(56) References Cited

U.S. PATENT DOCUMENTS

| | | | | |
|---|---|---|---|---|
| 4,898,641 A | * | 2/1990 | Ogihara et al. | 29/25.35 |
| 6,043,940 A | * | 3/2000 | Kamiyama et al. | 359/719 |
| 6,211,999 B1 | * | 4/2001 | Gopalan et al. | 359/326 |
| 6,673,330 B1 | | 1/2004 | Kitamura et al. | |
| 2004/0234867 A1 | | 11/2004 | Hatano et al. | |

FOREIGN PATENT DOCUMENTS

| | | |
|---|---|---|
| JP | 11-35393 A | 2/1999 |
| JP | 2002-300001 A | 10/2002 |
| JP | 2002300001 | * 10/2002 |
| JP | 2003-63894 A | 3/2003 |
| WO | 88/08271 A1 | 11/1988 |

OTHER PUBLICATIONS

Nagata; "Zukai Rendu Ga Wakaru Hon," pp. 56-59; Jan. 30, 2003.
Nakamura et al.; "Influence of Powder Supply on Radio-Frequency Power Stability and Compositional Uniformity in Near Stoichiometric LiTaO3 Crystal Grown by Double-Crucible Czochralski Method," Journal of Crystal Growth; 2002, Elsevier Science B.V.; vol. 245; pp. 267-272.
Bordui et al.; "Stoichiometry Issues in Single-Crystal Lithium Tantalate," Journal of Applied Physics; Oct. 1, 1995; vol. 78; No. 7; pp. 4647-4650.
Kim et al.; "Growth of LixTa1-xO3 Single Crystals and Their Optical Properties," Journal of Crystal Growth; 2001; vol. 229; pp. 243-247.
Translation of official communication issued in the counterpart International Application No. PCT/JP2004/015046, mailed on Aug. 31, 2006.

\* cited by examiner

*Primary Examiner* — Ling Choi
*Assistant Examiner* — Monique Peets
(74) *Attorney, Agent, or Firm* — Keating & Bennett, LLP

(57) ABSTRACT

An optical material includes lithium tantalate, and a molar composition ratio of lithium oxide and tantalum oxide ($Li_2O/Ta_2O_5$) in the lithium tantalate is in the range of 0.975 to 0.982. Since an optical material having a high refractive index is provided in an optical unit, at the same focal distance, a lens thickness can be significantly reduced. As a result, an optical electronic component and an optical electronic device including the optical material has a reduced size and thickness and is highly functional.

2 Claims, 6 Drawing Sheets

[Fig. 1]
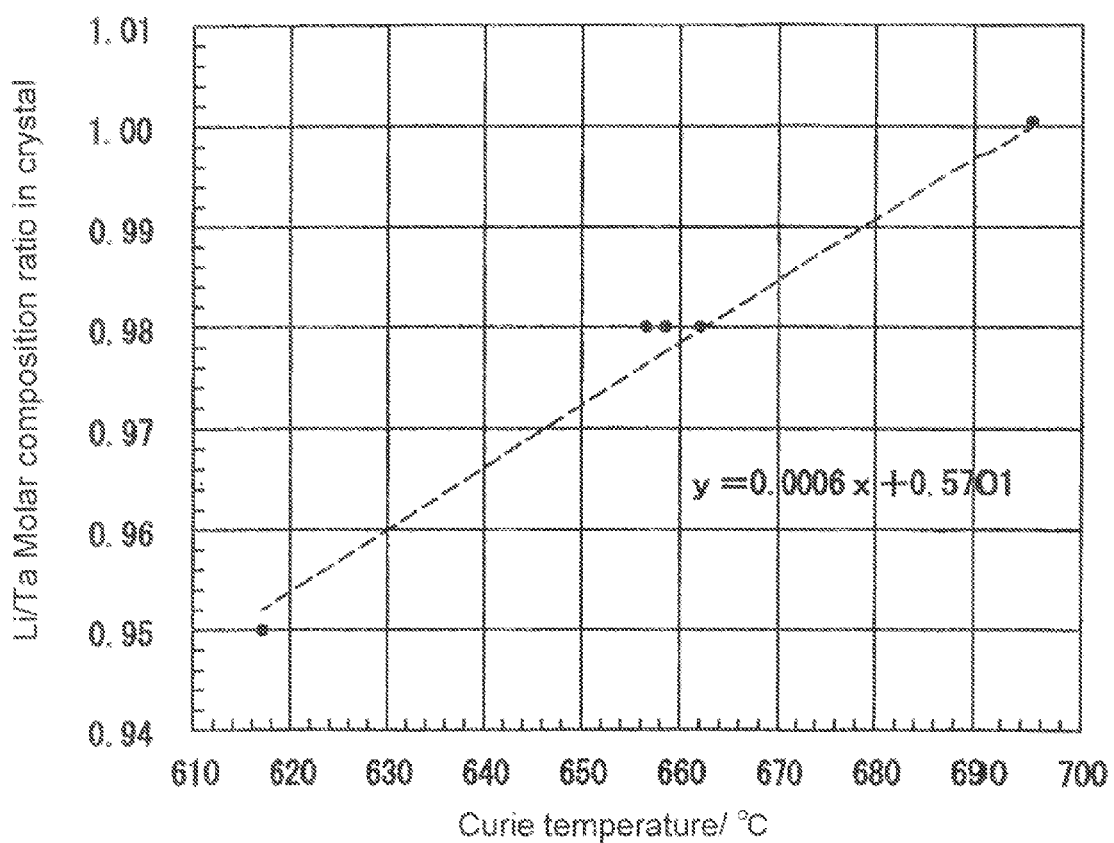

[Fig. 2]
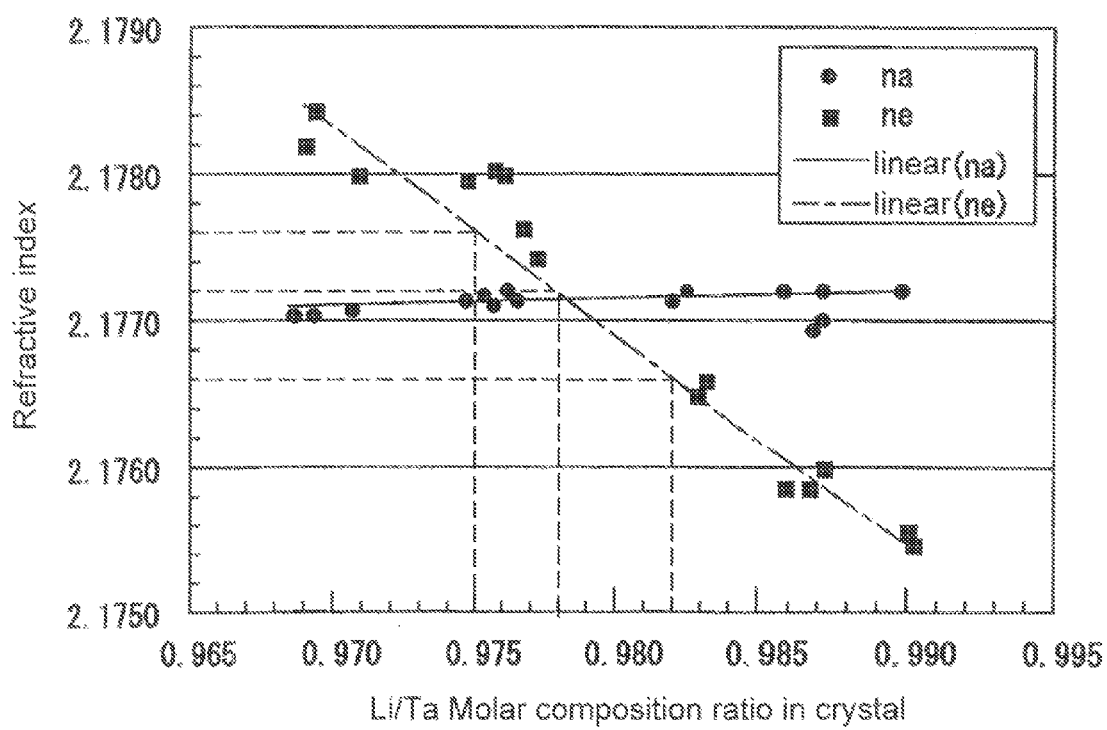

[Fig. 3]
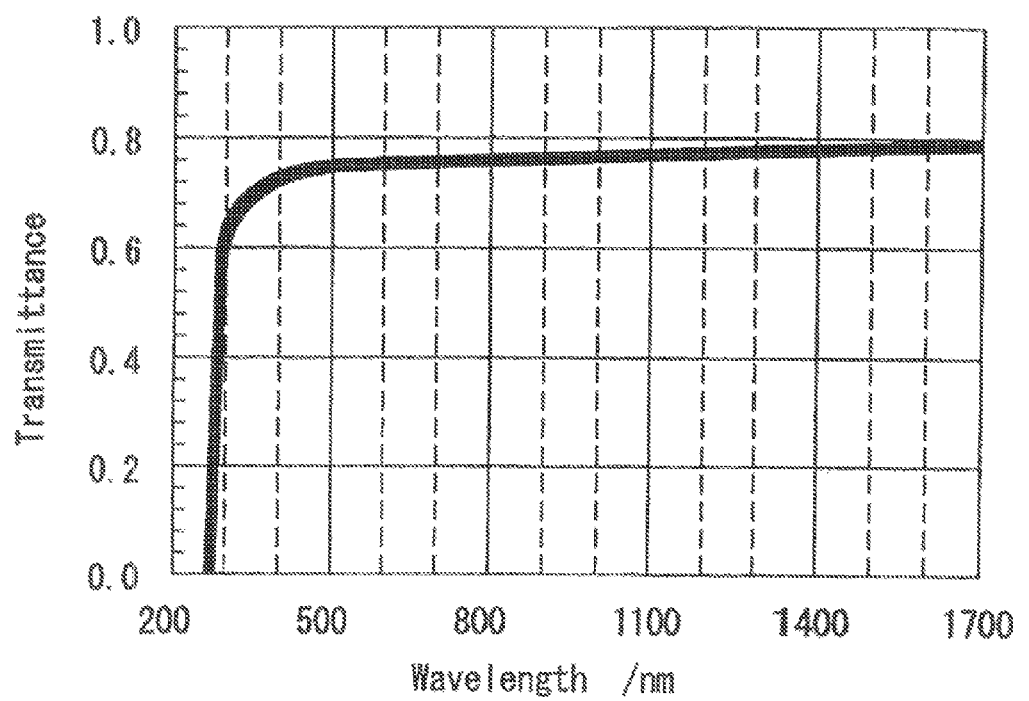

[Fig. 4]
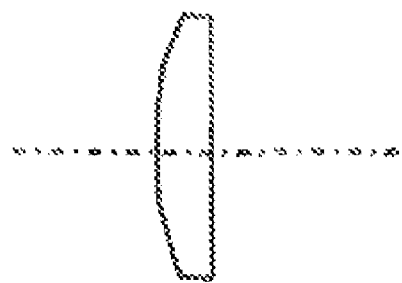
[Fig. 5]
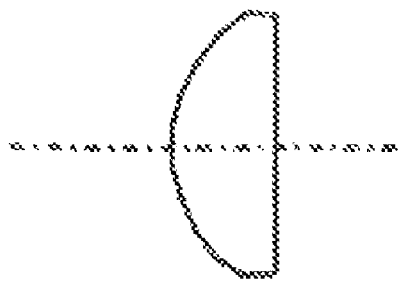

[Fig. 6]
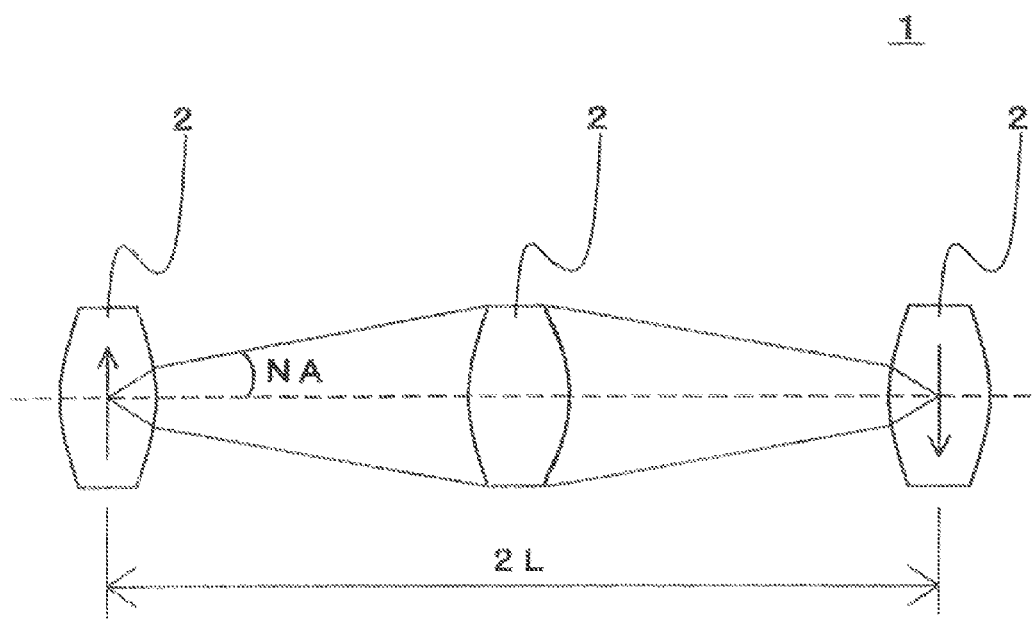

[Fig. 7]
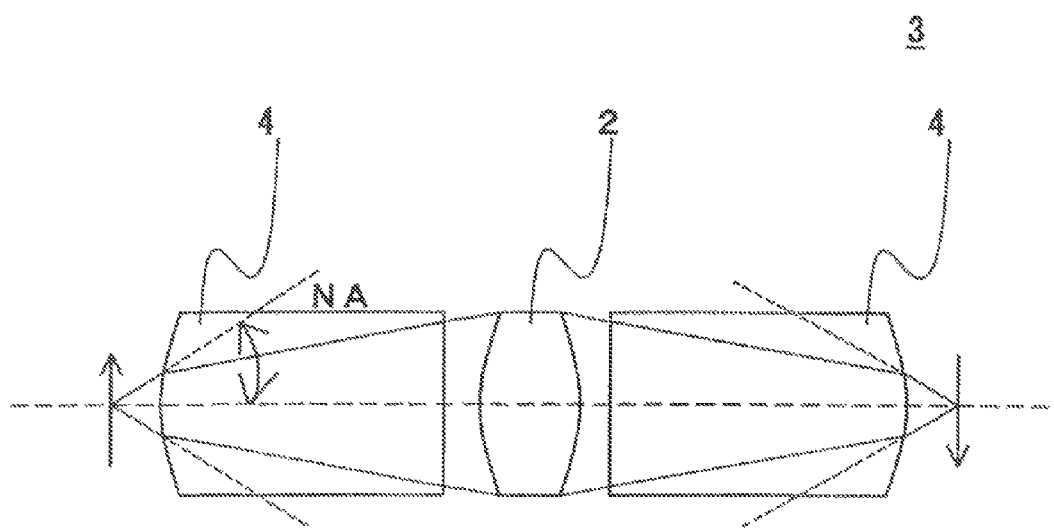

LENS MATERIAL, OPTICAL ELECTRONIC COMPONENT AND OPTICAL ELECTRONIC DEVICE

BACKGROUND OF THE INVENTION

1. Field of the Invention

The present invention relates to a lens material, an optical electronic component and an optical electronic device, and in particular, to a lens material having a reduced amount of birefringence, and optical electronic component including the same, and an optical electronic device including the same.

2. Description of the Related Art

As optical materials for an optical system, glass, plastics, synthesized quartz, calcium fluoride and other suitable materials are known.

Glass and plastics have low refractive indexes. For instance, a glass lens has a refractive index of substantially 1.5 (see, for example, JP No. 2859621 (Patent Literature 1)). When lenses having the same focal distance are manufactured using the glass, a curvature radius of the lens must be decreased. That is, when the glass is used, the thickness of the lens increases. Accordingly, miniaturization and thinning of the lens are difficult.

Furthermore, optical glasses made of materials having refractive indexes of substantially 1.7 to 2.0 have been developed. However, there is a problem in that as the refractive index increases, the coloring of the lens increases and the light transmittance in a short wavelength region (corresponding to a wavelength from blue to green) in the visible light region deteriorates.

On the other hand, with plastic lenses, a complicated shape can be inexpensively and easily molded. However, there is a problem in that, since the volume of the lens greatly varies as a result of environmental variations, such as temperature and humidity, the refractive index tends to vary, which causes variations in the focal distance (see, for example, S. Nagata, ZUKAI RENDU GA WAKARU HON, pp 56-59, (Jan. 20, 2003), First edition, Third printing (NIPPON JITSUGYOU SHUPPAN SHA) (Non-patent Literature 1)).

In addition, as an optical material for optical elements for wavelength conversion, optical diffraction, phase conjugate mirror and other properties, single crystals, such as lithium niobate and lithium tantalate, are known. The optical materials, which have refractive indexes of at least 2.0, can be miniaturized and thinned. However, the single crystals, being a uniaxial crystal, have different refractive indexes for ordinary light and extraordinary light. Accordingly, there is a problem in that birefringence is caused and doubling results. As a result, the single crystals could not be used in a lens and optical system.

There is a proposal for optical pickup lenses for magnetic optical disks, DVDs (Digital Versatile Disk) and other devices, in which lithium tantalate that generates the birefringence is used (see, for example, JP-A No. 11-312331 (Patent Literature 2)). However, a light incidence axis (light incidence direction) has to be set at an angle of at least 0° with respect to a crystal optical axis of a single crystal, (in particular, a crystal optical axis substantially coincides with a light incidence axis (within ±1°) or substantially 45° (within ±1°)). Furthermore, laser light that generates only a very monodispersed wavelength must be used and a target axis of the lens and an optical axis of the crystal must be precisely coincided. Accordingly, when, like in a general image pickup device, natural light (aggregate of lights having various wavelengths) comes in from all directions (angles), this proposal cannot be applied.

Lithium tantalate is a material that has a refractive index of at least 2.0 and high light transmittance in the visible light region. However, since the birefringence thereof is substantially 0.006, when light comes in from various directions, images are duplicated. Accordingly, it has not been used as a lens and optical material.

SUMMARY OF THE INVENTION

To overcome the problems described above, preferred embodiments of the invention provide a high refractive index lens material that is not affected by environmental variation, has high visible light transmittance, and has a birefringence within ±0.0005, and provide an optical electronic component and an optical electronic device including the same.

A lens material according to a preferred embodiment of the present invention includes lithium tantalate having a molar composition ratio ($Li_2O/Ta_2O_5$) of lithium oxide and tantalum oxide in the lithium tantalate in the range of 0.975 to 0.982, wherein the birefringence of the lithium tantalate is in the range of −0.0005 to 0.0005.

An optical electronic component according to another preferred embodiment of the present invention is made of the lens material described above.

An optical electronic device according to still another preferred embodiment of the present invention includes the optical electronic component described above.

According to preferred embodiments of the present invention, even with lithium tantalate that has a high refractive index and visible transmittance, the birefringence can be confined within a range of ±0.0005. Thereby, when the lithium tantalate is used as a lens, the same focal distance can be obtained with a larger radius of curvature. That is, the thickness of the lens can be reduced.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIG. 1 is a diagram showing a calibration curve between the Curie temperature and a molar composition ratio.

FIG. 2 is a diagram showing a relationship between the refractive index and a molar composition ratio.

FIG. 3 is a diagram showing a relationship between the respective wavelengths and linear transmittances.

FIG. 4 is a sectional view of a planoconvex lens due to an optical material according to a preferred embodiment of the present invention.

FIG. 5 is a sectional view of a planoconvex lens due to glass.

FIG. 6 is a sectional view of a relay lens system made of convex lenses.

FIG. 7 is a sectional view of a relay lens system made of a convex lens and columnar lenses.

DETAILED DESCRIPTION OF PREFERRED EMBODIMENTS

It was discovered that when a single crystal of lithium tantalate was grown, in the case where a crystal was grown under a particular ratio of lithium oxide and tantalum oxide, the birefringence was reduced, and thereby the present invention was conceived.

Birefringence means a difference of refractive indexes of ordinary light and extraordinary light. When the difference is large, an image is duplicated. Thus, a material having a large birefringence is difficult to use as an ordinary lens.

On the other hand, when the birefringence is within ±0.0005, since it is within the error of the refractive index of ordinary light, an image is not duplicated.

In lithium tantalate that is an oxide single crystal, a molar composition ratio ($Li_2O/Ta_2O_5$) of lithium oxide and tantalum oxide in the lithium tantalate is in the range of 0.975 to 0.982.

When the molar composition ratio is less than 0.975 or exceeds 0.982, the desired birefringence cannot be obtained.

When measuring the molar composition ratio of lithium oxide and tantalum oxide, it is often difficult to quantitatively measure the molar composition ratio with a precision of 0.01 with a composition analysis. Accordingly, the molar composition ratio is preferably measured using the Curie temperature, which is a physicality value that is sensitive to the molar composition ratio of lithium oxide and tantalum oxide, as an index.

However, depending on a measurement method of the Curie temperature, the composition may differ. Accordingly, the molar composition ratio according to various preferred embodiments of the present invention means a ratio obtained according to the measurement method described below.

The Curie temperature is measured preferably using a differential thermal analysis method.

Measurement conditions are as follows.

Measurement temperature range: from room temperature to 800° C.

Temperature rise speed: 20° C./min.

Gas: air 100 ml/min.

Measurement vessel: platinum cell.

Reference sample: platinum.

Sample amount: 130 mg.

Temperature calibration: With indium (melting temperature; 156.6° C.), tin (melting temperature; 231.97° C.), zinc (melting temperature; 419.6° C.), aluminum (melting temperature; 660.4° C.) and gold (melting temperature; 1064.4° C.), from standard melting temperatures and measurement values of melting temperatures, a calibration equation is prepared.

Standard deviation values as measured temperatures are within 1.0° C.

A detection amount of $\Delta(Li/Ta)$ per 1° C. variation of the Curie temperature is $6 \times 10^{-5}$.

A calibration curve between the Curie temperature and a molar composition ratio is shown in FIG. 1.

Lithium tantalate may include at least one of magnesium, zinc and scandium.

When an optical material made of an oxide single crystal is irradiated with a light source (xenon or halogen lamp) for an extended period of time, coloring caused by color centers may occur. In order to prevent this from occurring, the above-described elements can be added. This is because the oxides do not substantially show the absorption under the light source.

Furthermore, an addition amount thereof is between 0.5 mole percent and 10 mole percent. When the addition amount is less than 0.5 mole percent, an advantage obtained by the addition thereof cannot be sufficiently obtained. The upper addition amount is set at 10 mole percent due to the solid solubility limit.

The optical electronic components that may be formed using the lens material include, for instance, a light-pickup lens, an integrator lens and other suitable components.

Furthermore, the optical electronic devices that may be formed using the optical electronic components include, for instance, an endoscope, a magneto optical disk, a DVD, a liquid crystal projector, a laser printer, a handy scanner, a digital camera and other suitable devices.

More specific examples of preferred embodiments of the present invention will be described below. However, the present invention is not restricted to these examples.

EXAMPLE 1

Commercially available raw material powders of 99.99% purity $Li_2CO_3$ and $Ta_2O_5$ were used. The raw material powders were weighed at a molar ratio of $Li_2CO_3$: $Ta_2O_5$=0.55: 0.45 so as to include a total of 6500 g and placed in a Teflon (registered trade mark) vessel, followed by applying dry mixing. After mixing, the mixture was calcined in air at 1300° C. for 8 hrs, and thereby, a raw material was prepared. The calcined raw material was poured into a soft urethane rubber mold and a molded body was prepared under static pressure of $1.96 \times 10^8$ Pa.

An Ir (iridium) crucible having an outer dimension of 140 mm, a height of 100 mm and a thickness of 2.0 mm and an Ir cylindrical tube having an outer dimension of 100 mm, a height of 110 mm and a thickness of 1.0 mm were prepared. The cylindrical tube was inserted so as to coincide with a central axis of the crucible. Inside of the combined crucible (hereinafter, referred to a "double crucible"), the molded body was filled, followed by heating the crucible with high frequency induction heating, and thereby a molten liquid was prepared. After a temperature of the molten liquid was stabilized at a predetermined temperature, with a lithium tantalate single crystal that is cut such that a longer dimension is substantially parallel with an [010] axis as a seed crystal, according to a double crucible method (JP-A-13-287999), a crystal was grown.

A growing crystal was grown from immediately after the start of the single crystal growth using a diameter automatic control system, such that a diameter of a straight body portion is 50 mm.

A molar fraction $Li_2O_3/(Li_2O_3+Ta_2O_5)$ of the raw material molten liquid was maintained in the range of 54.5 to 55.5 mole percent. With a double-structured crucible, a lithium tantalate single crystal having a target composition was pulled up from an inner crucible. While sequentially measuring a weight of a pulling-up single crystal, a weight per unit time (weight growth speed) was obtained. At the weight growth speed, a raw material having the same composition as the growing single crystal, specifically, a composition where a molar fraction of $Li_2O_3/Ta_2O_5$ is controlled in the range of 0.975 to 0.982 was continuously provided between the outer crucible and the inner crucible to control the crystal composition precisely, and thereby a single crystal of which birefringence is within a target range was grown.

While pulling up a seed crystal at a constant speed for a predetermined time, a molten raw material was solidified. Thereafter, the single crystal was elevated to a predetermined position and cooled over 20 hrs.

The obtained single crystal was sandwiched with platinum plates facing in an [001] axis direction of the single crystal and disposed in a resistance heating furnace. This was heated to 750° C. and maintained there for a sufficient amount of time. Thereafter, while electricity was flowing at a current density of DC 0.5 $mA/cm^2$ through the platinum plates, the single crystal was gradually cooled at a speed of 20° C./h to room temperature.

The Curie temperature of the obtained single crystal was obtained using the foregoing differential thermal analysis method (TG-DTA (trade name), manufactured by Seiko Instrument) under the foregoing measurement conditions and found to be 661.5° C. When the value was referenced to the calibration curve to obtain the molar composition ratio of lithium oxide and tantalum oxide, a molar composition ratio of 0.980 was measured.

The single crystal was mechanically cut and a wafer (Y-cut wafer) having surfaces vertical to a b axis was prepared. Both surfaces of the wafer were physically mirror polished with a polishing agent to a thickness of 0.5 mm. Thus, a sample according to a preferred embodiment of the present invention was obtained.

The sample was measured of the linear transmittance and the refractive index.

The refractive index was measured of both surfaces of the wafer at a wavelength of 632.8 nm using a prism coupler type refractive index measurement unit (manufactured by Metricon Co., Ltd.).

The measurement accuracy of the unit is ±0.0001 and the measurement resolution power is ±0.00008.

As a result, the refractive index of ordinary light, $n_o$, was found to be 2.1770±0.0002. Since the refractive index of extraordinary light, $n_e$, was within the resolution power of the measuring unit to $n_o$, that is, coincided with $n_o$ at $\Delta n = |n_o - n_e| \leq 0.0002$, the single crystal was found to be an optically isotropic material.

Results are shown in FIG. 2.

The linear transmittance was measured with a spectrophotometer (trade name: UV-200S, manufactured by Shimadzu Corporation) in a measurement wavelength range of 200 nm to 1700 nm. An absorption edge was at substantially 260 nm, and in a wavelength range of at least 300 nm, the absorption coefficient was 0.5 cm$^{-1}$.

Results are shown in FIG. 3.

From the foregoing sample, a disk sample having a diameter of 20 mm was cut out and the sample was processed to a planoconvex lens having a front curvature of 50 mm and a rear curvature of infinity. The focal distance thereof was measured and found to be 42 mm (FIG. 4).

For comparison, a planoconvex lens having a focal distance of 42 mm was prepared using an optical glass material BK-7 (borosilicate crown glass, n=1.51, manufactured by Shot Co., Ltd) and found to have a front curvature of 23 mm (FIG. 5).

From the above, the thickness of the inventive lens material can be greatly reduced as compared to glass.

EXAMPLE 2

The NAs and brightness of a relay lens 1 shown in FIG. 6, which is made of only convex lenses 2 that are made of a material according to a preferred embodiment of the present invention (gaps between the respective lenses are made of air), a rod lens relay 3 including a convex lens 2 and columnar lenses 4 that are arranged as shown in FIG. 7 and made of glass (BK-7, n=1.51), and a rod lens relay 3 including a convex lens 2 and columnar lenses 4 that are arranged as shown in FIG. 7 and are made of a material according to a preferred embodiment of the present invention, and the results were compared. The NA means an effective diameter (aperture diameter) through which an image enters. Furthermore, arrow marks in the drawings show a substance whose image is inverted due to an imaging effect.

In Table 1, based on the relay lens 1 including only the convex lenses 2 shown in FIG. 6, relative numerical values of the rod lens relays 3 made of glass and the material according to various preferred embodiments of the present invention are shown.

TABLE 1

|  | Optical path length | NA | Brightness |
| --- | --- | --- | --- |
| Relay lens made of only convex lenses | 1.0 | 1.0 | 1.0 |
| Glass (BK-7) | 0.6 | 1.5 | 2.3 |
| Inventive material | 0.5 | 2.2 | 4.8 |

As shown in Table 1, when a material according to a preferred embodiment of the present invention is used as the material of the columnar lens 4, in comparison with an ordinary relay lens 1 where the convex lenses 2 alone are used, an optical path length L is shortened and the NA is increased. Accordingly, the brightness is increased in proportion to the refractive index. Thereby, since an effective diameter of the lens can be reduced, in an endoscope for instance, a diameter of the endoscope can be reduced. Accordingly, an endoscope that can be easily operated and that reduces stress on a patient can be provided. Furthermore, since two units of the same optical system can be readily arranged, a stereo optical unit can be provided, and thereby a detailed three-dimensional image can be observed.

A lens material according to a preferred embodiment of the present invention can be used for a lens and the lens can be used in an optical electronic component.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. A lens comprising:
   lithium tantalate including a lithium oxide and a tantalum oxide; wherein
   a molar composition ratio of the lithium oxide and the tantalum oxide ($Li_2O/Ta_2O_5$) in the lithium tantalate is in a range of 0.975 to 0.982; and
   a birefringence of the lithium tantalate is in a range of −0.0005 to 0.0005.

2. An optical electronic device including the lens according to claim 1.

* * * * *